United States Patent [19]
Ogata et al.

[11] Patent Number: 5,751,002
[45] Date of Patent: May 12, 1998

[54] ION IMPLANTATION APPARATUS

[75] Inventors: Seiji Ogata; Yuzo Sakurada; Nakaya Chida; Takeshi Hisamune, all of Chigasaki, Japan

[73] Assignee: Nihon Shinku Gijutsu Kabushiki Kaisha, Chigasaki, Japan

[21] Appl. No.: 594,320

[22] Filed: Jan. 30, 1996

[30] Foreign Application Priority Data

Jan. 31, 1995 [JP] Japan ................................. 7-034675

[51] Int. Cl.$^6$ ................................................. H01J 37/147
[52] U.S. Cl. ............................... 250/492.21; 250/398
[58] Field of Search ....................... 250/449.21, 398, 250/492.2, 396 R, 396 ML

[56] References Cited

U.S. PATENT DOCUMENTS 4,254,340  3/1981  Lamplan et al. ................. 250/492.21

*Primary Examiner*—Kiet T. Nguyen
*Attorney, Agent, or Firm*—Carothers & Carothers

[57] ABSTRACT

An ion implantation apparatus is provided with an ion source and a mass spectrometer having an analyzer magnet and is adapted to take out ions having a predetermined kinetic energy and mass from other ions produced in the ion source. It further includes a scanner system for scanning an ion beam of the take-out ions and irradiating the ion beam onto a substrate. The scanner system includes a deflection electro-magnet which is disposed downstream of the mass spectrometer for deflecting the ion beam in a predetermined plane with respect to a reference axis. A second vacuum chamber portion through which the ion beam passes in the magnetic field of the deflection electro-magnet is provided and a first vacuum chamber portion electrically independent of the second vacuum chamber portion is also provided through which the ion beam passes in the magnetic field of the mass analyzer. A third vacuum chamber portion is also provided through which the ion beam passes and in which the substrate is arranged for irradiation. The second vacuum chamber portion is applied by a potential for modulating the potential of the ion be and the deflection electro-magnet defects the modulated ion beam so that the deflection angle of the ion beam is modulated and the ion beam is scanned and irradiated onto the substrate.

15 Claims, 14 Drawing Sheets 5,751,002

ION IMPLANTATION APPARATUS

BACKGROUND OF THE INVENTION

1. Field of the Invention

This invention relates to an ion implantation apparatus, and more particularly to an ion implantation apparatus in which a large current of ions, for example, Borons, Phosphorus or Arsenic, such as about 1 milli-ampere (1 mA) is scanned and irradiated into a substrate of large area such as a silicon wafer of larger than 200 mm diameter or a glass plate with silicon film, having about 200 mm sides for manufacturing semiconductor integrated circuits for liquid-crystal display device.

2. Description of the Prior Art

FIG. 1 shows one example of ion implantation apparatus of the medium current type. It comprises an ion source a, a mass analyzer b having an analyzer magnet and intended to separate ions having a predetermined kinetic energy and mass from other ions produced in the ion source a, an acceleration system having an acceleration tube c for accelerating or decelerating the ions separated by the mass analyzer b, a converging lens system d, a deflector/scanner system having Y direction scanning electrode e1 and X direction scanning electrode e2, and a sample processing chamber g which contains a substrate or sample f to be ion-implanted.

In the ion implantation system, it is important that the scanning system should be constructed to eliminate neutral particles in order to improve the uniformity of the doping. The neutral particles are generated by colliding the ion beams with residual gas molecules while the ion beams from the ion sources are transmitted to the sample f, and making the charge exchange there-between. The ion implanter system is therefore provided with means for deflecting the center line of the beams by 7° to avoid the incidence of the neutral particles on the sample, lest the uniformity should be deteriorated by an enhanced doping at the central portion of the sample with the neutral particles. That is, it is usual to provide a voltage control in the X direction scanning electrode e2 by superimposing a DC bias for deflecting the ion beams by 7° on a scanning triangular wave for the X direction scanning electrode e2.

FIG. 2 and FIG. 3 show one example of ion implantation apparatus of the large current type. In FIG. 2, potentials are applied independently to an ion source h and a mass-analyzer i having an analyzer magnet. An end housing m arranged at the front of the mass-analyzer i contains a wafer disk k into which plural substrates j are attached.

As shown in FIG. 3, the wafer disk k is fixed to a rotary shaft n, and it is moved backwards and forwards in the directions $P_1$ and $P_2$, together with the rotary shaft n. In that arrangement, ions q are taken out from the ion source h so as to have a predetermined energy, and mass-separated by the mass analyzer i. Then, they are irradiated onto the substrates j which are rotated and moved backwards and forwards in order to be irradiated uniformly.

Generally, an ion beam tends to diverge due to its space charge. The space charge effect is proportional to the intensity of the beam current, to (mass of ion)$^{1/2+1}$, inversely proportional to (electro-static potential of ion)$^{3/2}$, and inversely proportional to (mean radius of beam). For example, when a Boron (B$^+$) beam has about 100 KeV, which is used for usual ion implantation, the space charge effect becomes remarkable under the current of larger than 1 milli-ampere (1 mA), and in this case the divergence of the ion beam cannot be neglected.

The ion beam has positive charge. Secondary electrons are generated by the collision of the ion beams with the wall of the vacuum container and the residual gas, and the ion beam absorbs the secondary electrons and so the space charges are electrically neutralized. At this time, when a strong electric field is applied to the ion beam by an electro-static deflector, the electrons flow out from the ion beam and so the electrical neutralization is lowered. Thus, the space charge effect of the ion beam becomes remarkable. Accordingly, in the ion beam apparatus in which the space charge effect becomes remarkable, the controllable beam current intensity is limited depending on the electro-static deflector or electro-static lenses.

In the ion implantation apparatus of the medium current type as shown in FIG. 1, the ion beam is scanned or swept at the frequency of about 1000 HZ in order to secure an uniformity of the ion injection into The substrate f. Because the electro-static deflector is used for such a high frequency scanning, the ion beam divergence becomes remarkable due to the space charge effect under the large current of 1 milli-ampere (1 mA), and it is difficult in that the standard deviation of the injection distribution of the ion into the substrate f is made under 1 percent (1%). For example, when the beam current is equal to 1 milli-ampere (1 mA), it takes about one minute to inject dopants of $1\times10^{15}$/cm$^2$ into the substrate of 8 inches diameter. Accordingly, when the injection of the ion is above $1\times10^{16}$/cm$^2$, there is a problem that a sufficient rate of flow cannot be obtained.

In the ion implantation apparatus of the large current type as shown in FIG. 2, it is necessary to improve the neutralization of the space charge so as not to diverge the ion beam q. Accordingly, the electro-static deflector cannot be used. Accordingly, in order that the ion beam is uniformly injected into the substrate j maintaining the neutralization of the space charge, the substrate j is mechanically moved while the ion beam q is fixed. However, the upper limit of frequency is about 1 Hz. Without mechanically moving the substrate j, the magnetic field is sometime changed with time by a magnetic deflector so as to scan the ion beam q. However, when the magnetic field is changed at a high rate, eddy current generates and so it is difficult to control the ion beam at the high rate of 10 Hz. Thus, it is difficult to scan the ion beam at a frequency of 10 Hz, maintaining the space charge neutralization under the condition of the large current such as 10 mmA. Accordingly, a sufficiently large rate of flow can be obtained by the ion implantation apparatus of the large current type. However, the uniformity is deteriorated in comparison with the middle current type ion implantation apparatus.

As shown in FIG. 4, a mass-separation slit s is generally arranged at a position $f_0$ where the ion beam from the ion source a is focussed due to the lensing operation of the mass analyzer b. However, as shown by the dash line, the ion beam from the ion source a diverges somewhat due to the space charge effect. Accordingly, the focussing position f is shifted forwards from the position $f_0$. The shifted distance depends on the shape of the ion beam from the ion source a. For example, when the medium current type ion implantation apparatus is of the Freeman-type, in which plasma is generated by the impact of the thermal electrons from the filament in the ion source, and the ion (P$^+$) beam of current of about 1 mA is extracted from the ion source by a voltage of 30 kV, the shift of the focussing position can be neglected. On the other hand, when the ion beam current is equal to about 5 mA, the shift distance of the focussing position becomes above 100 mm. Accordingly, when the ion beam current changes over the wide range, there is the problem that the mass-separation resolving power is lowered depending on the ion beam current.

As above described, in the conventional ion implantation apparatus, when a good uniformity is obtained, rate of flow is lowered. On the other hand, when a high rate of flow is obtained, uniformity is deteriorated. Further, the larger the size of the substrate, the more is this tendency, and the mass-separation resolving power changes much with the ion beam current.

SUMMARY OF THE INVENTION

Accordingly, it is an object to provide an ion implantation apparatus which can obtain a high rate of flow with a good uniformity. In accordance with in aspect of this invention: an ion implantation apparatus is provided which includes an ion source and a mass analyzer having an analyzer magnet and which is adapted to extract ions having a predetermined kinetic energy and mass from other ions produced in the ion source, and a scanning ion beam of the take-out ions and means for irradiating the ion beam onto a substrate, the improvements including a deflection electro-magnet arranged at the downstream side of the mass analyzer for deflecting the ion beam in a predetermined surface with respect to a reference axis, a second vacuum chamber portion, through which the ion beam passes in the magnetic field of the deflection electro-magnet which is electrically independent of a first vacuum chamber portion through which the ion beam passes in the magnetic field of the mass analyzer, and a third vacuum chamber through which the ion beam passes and in which a substrate to be implanted is arranged, is provided wherein the potential of the ion beam is modulated in the magnetic field of the deflection electro-magnet so that the deflection angle of said ion beam is modulated and the ion beam is scanned and irradiated onto the substrate.

The foregoing and other objects, features, and advantages of the present invention will be more readily understood upon consideration of the following detailed description of the preferred embodiment of the invention, taken in conjunction with the accompanying drawings.

DESCRIPTION OF THE PREFERRED EMBODIMENTS

Next, embodiments of this invention will be described with reference to the drawings.

Figure 1:
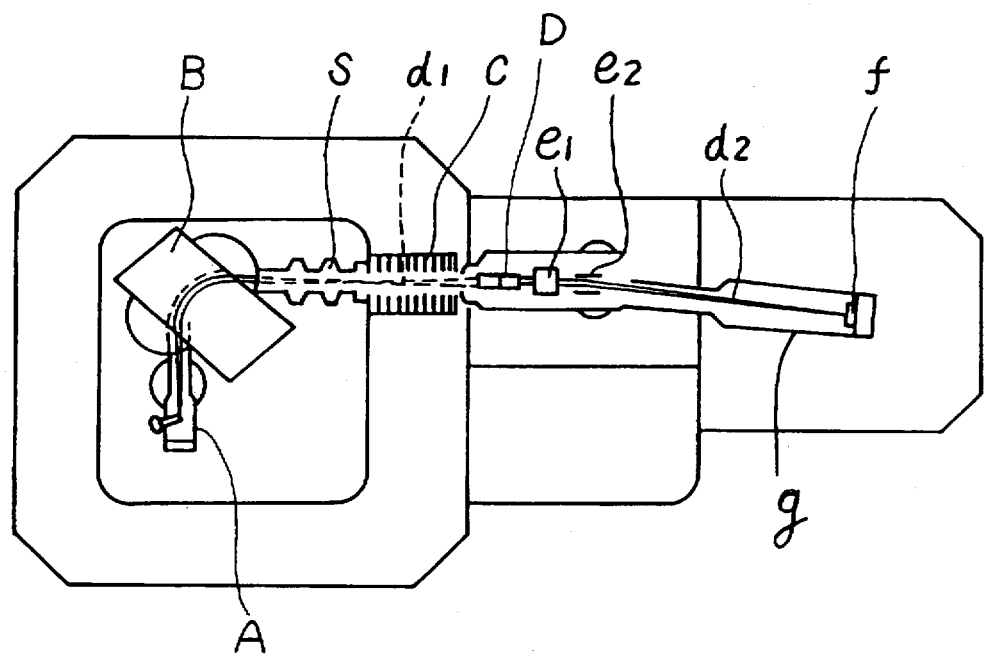
FIG. 1 is a schematic plan view of a conventional ion implantation apparatus.
Figure 2:
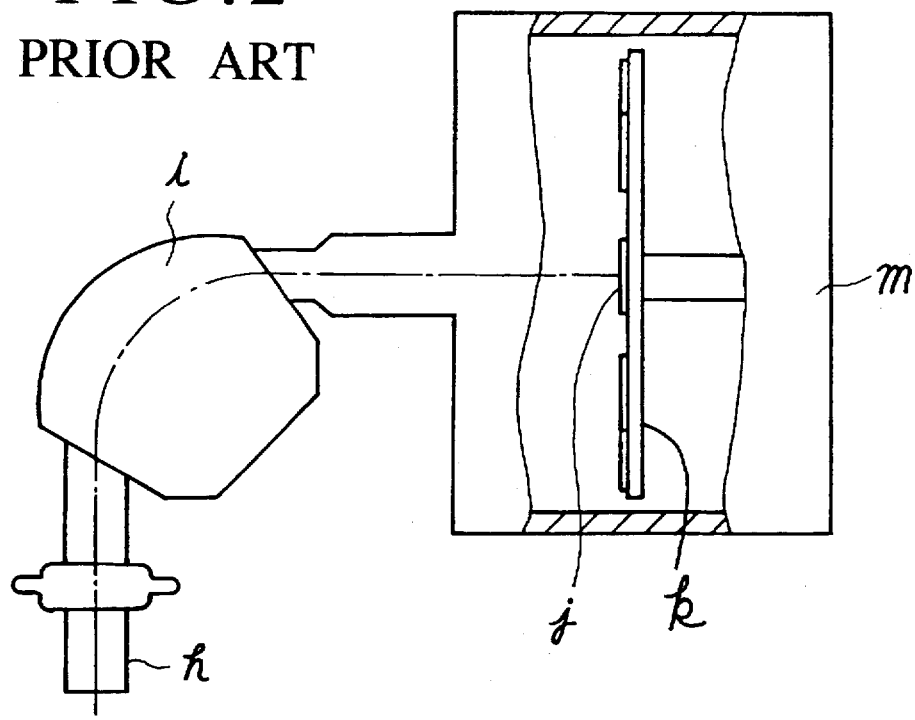
FIG. 2 is a partial broken-away plan view of another conventional ion implantation apparatus.
Figure 3:
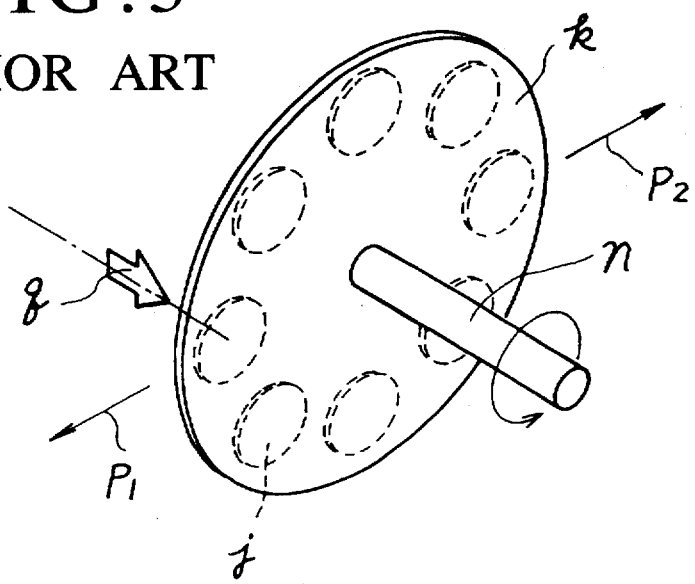
FIG. 3 is a perspective view of an important part of the apparatus of FIG. 2.
Figure 4:
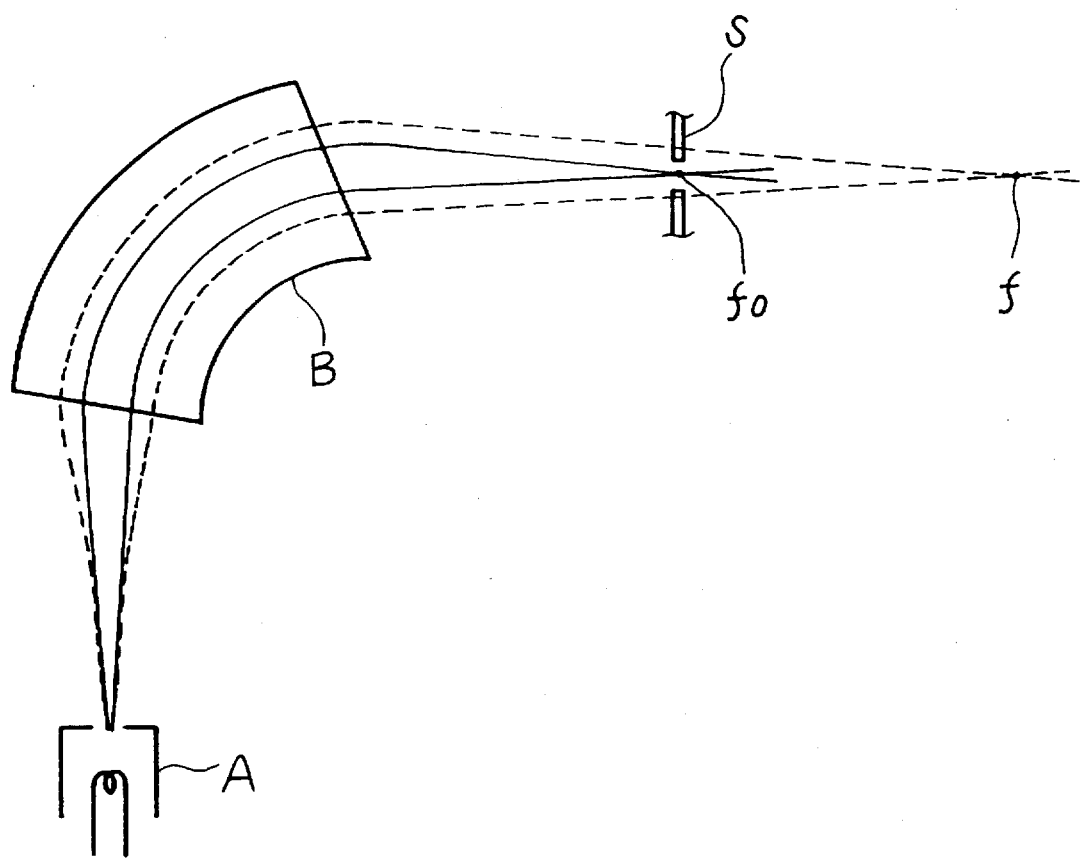
FIG. 4 is a schematic view for explaining the divergence of the ion beam in the apparatus of FIG. 2.
Figure 5:
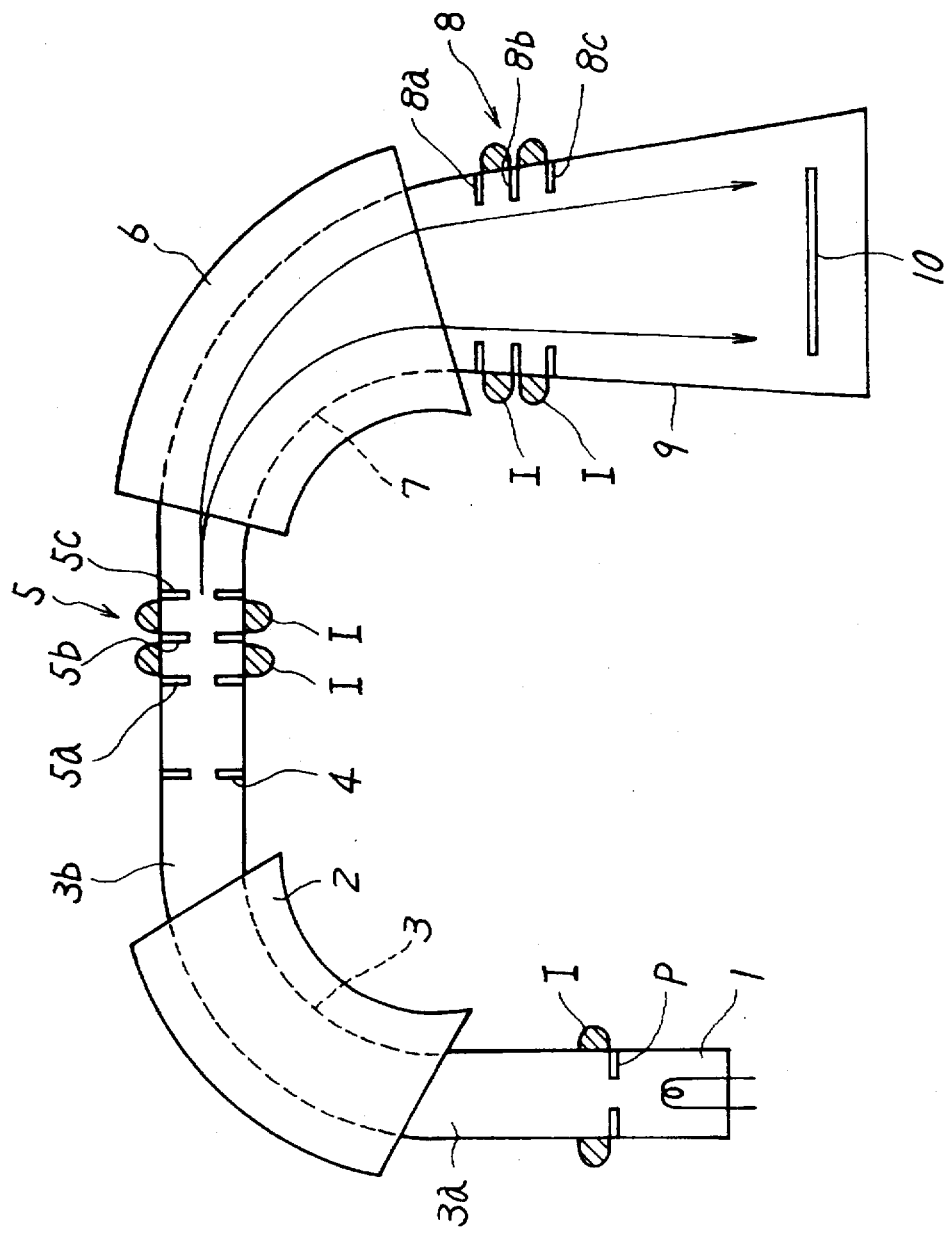
FIG. 5 is a plan view of an ion implantation apparatus according to a first embodiment of this invention.
Figure 6:
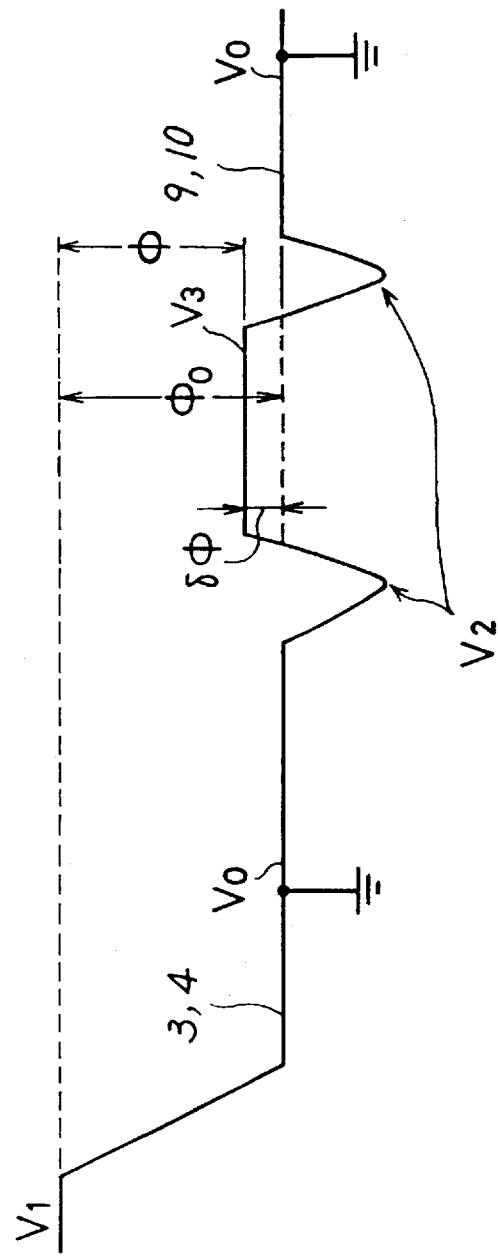
FIG. 6 is a potential graph for explaining the operation of the apparatus of FIG. 5.
Figure 7:
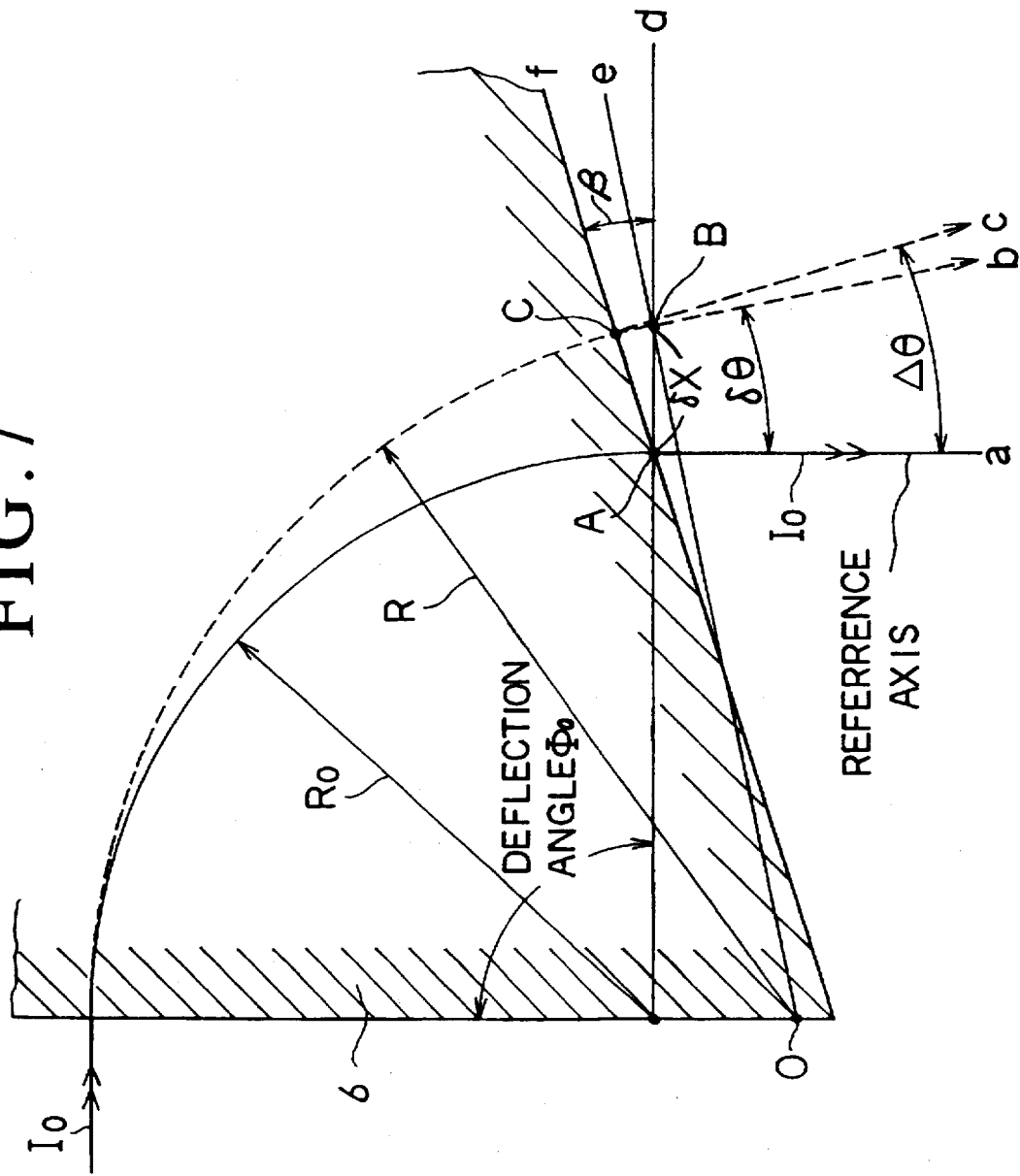
FIG. 7 is a graph for explaining the operations of the apparatus of FIG. 5.

FIG. 5 to FIG. 7 show the first embodiment of this invention.

An ion source 1 is arranged at one end in an analysis tube 3, which is a part of a vacuum chamber. A mass analyzer or mass-separation electro-magnet 2 surrounds the analysis tube 3 at the front of the ion source 1. A mass separation slit 4 is arranged at the front of the mass separation electro-magnet 2 in a downword stream portion 3a of the analysis tube 3. A deflection chamber 7 is formed integrally with the analysis tube 3 which is another part of the vacuum chamber. A deflection electro-magnet 6 arranged at the front of the mass separation slit 4, surrounds the deflection chamber 7. Although the deflection chamber 7 is formed integrally with the analysis tube 3, the former is electrically independent of the latter. A scanning tube 9 which is a further part of the vacuum chamber, is formed integrally with the deflection chamber 7, and the former is electrically independent of the latter. A substrate 10 is arranged at one end in the scanning tube 9. Electrode assemblies 5 and 8 are arranged at at the back and front of the deflection magnet 6, and they consist of annular electrodes 5a, 5b, 5c and 8a, 8b, 8c, respectively. As shown in FIG. 6, the analysis tube 3, the mass-separation slit 4, the scanning tube 9 and the substrate 10 are put at the ground potential $V_0$. A negative potential $V_2$ is applied to the electrode assemblies 5 and 8. The substrate 10 is driven upwards and downwards in the direction vertical to the sheet of FIG. 5 with a not-shown mechanism. A sufficiently high potential $V_1$ applied to the ion source 1, insulated from an extracting electrode P by an insulator I. A potential $V_3$ applied to the deflection chamber 7 is modulated around a constant potential such as the ground level $V_0$ at an amplitude of about 10% of the difference $\phi_0$ between the potential $V_1$ applied to the ion source 1 and the ground potential $V_0$, at a frequency of about 100 Hz.

Insulators I are interposed between the electrodes 5a and 5b, 5b and 5c, 8a and 8b, and 8b and 8c. The ground potential $V_0$ is applied to the electrode 5a. A sufficiently large negative potential $V_2$ is applied to the middle electrode 5b. And the above described potential $V_3$ is applied to the electrode 5c. And nearly the exit of the deflection electromagnet 6, the potential $V_3$ is applied to the electrode 8a. The potential $V_2$ is applied to the middle electrode 8b and the ground level $V_0$ is applied to the electrode 8c.

Thus, a potential distribution as shown in FIG. 6 can be obtained. Next, the detail will be described with reference to FIG. 5. Ions are extracted from the ion source 1 by the potential $V_1$. Ground level potential $V_0$ is applied to the upward stream portion 3a of the analysis tube 3, the downward stream portion 3b of the analysis tube 3 and the mass separation slit plate 4. The potential is lowered to the negative potential $V_2$ by the electrode 5a and raised up to the potential $V_3$ in the deflection chamber 7. And the potential is lowered to the potential $V_2$ by the electrode 8b of the electrode assembly 8. Further, the potential is raised to the ground potential $V_0$ in the scanning tube 9. The deflection electro-magnet 6 may be insulated from the deflection chamber 7 and so the potential of the deflection electro-magnet 6 can be at the ground level $V_0$.

The ion is circularly moved with a constant kinetic energy, passing a constant magnetic field. The radius of circular motion depend on the kinetic energy. When the radius of the ion locus is changed by the magnetic field of the electro-magnet 6, is corresponding deflection angle is changed. Accordingly, when the kinetic energy of the ion introduced into the electro-magnet 6 is changed, the deflection angle of the ion beam is changed at the exit of the electro-magnet 6. Thus, the ion beam can be deflected along the plane of the FIG. 5. Next, operation can be quantitatively discussed.

An ion moves in a circle when it passes through a constant magnetic field B and an electro-static potential $\phi_0$. The radius $R_0$ of the ion locus is expressed by the following formula.

$$R_0 = \frac{1}{B}\left(\frac{2m\phi_0}{e}\right)^{1/2}$$

Where e represents ion charge, and m an ion mass. When the electro static potential changes slightly as $\phi = \phi_0 + \delta\phi$, the radius changes slightly as $R = R_0 + \delta R$. The radius of the ion locus is formulated by the $R = R_0 \cdot (1 + \delta\phi/2\phi_0)$. On the other hand, when the radius is slightly changed, the displacement $\delta X$ and angle $\delta\theta$ at the exit of the electro-magnet 6 are formulated by $$\delta X = \delta R(1 - \cos(\psi_0))$$

$$\delta\theta = \frac{\delta R}{R_0} \times \sin(\psi_0),$$

where $\psi_0$ represents a deflection angle. And when the exit angle at the exit of the electro-magnet 6 is $\beta$, an angle $\Delta\theta$ made between the reference axis a and the ion beam is formulated by $$\Delta\theta = \frac{\tan \beta}{R_0} \times \delta X + \delta\theta.$$

Accordingly, when the electro-static potential of the ion introduced into the electro-magnet 6 is changed slightly $\phi = \phi_0 + \delta\phi$, the angle $\Delta\theta$ between the reference axis a and the ion beam, is formulated by $$\Delta\theta = \frac{\delta\phi}{2\phi_0} \times [\tan \beta(1 - \cos(\psi_0)) + \sin(\psi_0)].$$

In the above described formula, $\beta$ represents the exit angle of the electro-magnet 6. On the other hand, an incident angle of the electro-magnet 6 has a constant value $\alpha$. However, it has no relationship with he present analysis. Accordingly, the angle $\alpha$ is made 0. In FIG. 7, a DC magnetic field is generated perpendicular to the plane of FIG. 7 in the deflection electro-magnet 6. It is assumed that the magnetic field is constant between the incident point and the exit point in the electro-magnet 6. However, actually the magnetic field is distorted at the incident point and the exit anoint of the ion beam $I_0$. The ion beam does not actually flow in the manner as shown in FIG. 7. For the theoretical description, it is assumed that such distortion and leakage does not occur.

FIG. 7, the ion beam $I_0$ flows in a circle of the radius $R_0$, receiving the Lorentz's force, when the electro-magnetic field intensity is constant. Accordingly, the ion beam $I_0$ flows out from the electro-magnet 6 in the direction tangential to the circular motion. The direction of the ion beam $I_0$ at the exit point A is made the reference axis a.

Since the electro-static field is modulated in the deflection electro-magnet 6, in the above described manner, the ion beam $I_0$ runs on the circle of the radius R as shown by the dashed line in FIG. 7. A line d passing through the point A is perpendicular to the reference axis a. A line f passing through the point A is at an angle of $\beta$ to the line d. A crossing of the circle of the radius R and line f, is rendered a point C. A line tangential to the circle of the radius R at the point C is rendered a line c. When the circular arc of the radius R to the line d is within the magnetic field, the ion beam $I_0$ exits from the point B. A line b is tangential to the circular arc of the radius R at the point B. Further, a line e passing through the point B is perpendicular to the line b. Thus, $\delta X$ is equal to the distance between the point, A and B. $\delta\theta$ is an angle of the line a to the line b. $\Delta\theta$ is an angle of the reference axis a to the line c. The above described formulas 1 to 5 are obtained under the above described conditions.

For example, the deflection angle $\psi_0$ is equal to 90° and the exiting angle $\beta$ is equal to 35°. The distance between the electro-magnet 6 and the substrate 10 is equal to 2 m. When the electro-static potential through which the the ion passes, is changed by 7% of the potential difference voltage $\phi_0$, the exiting ion beam deflects by about 5 degree relative to the reference axis a. Thus, the beam displacement on the substrate 10 is equal to about 17 cm. Accordingly, the electro-static potential through which the ions pass in the electro-magnet 6, is modulated at the amplitude of 7% of the potential difference voltage $\phi_0$ and the substrate 10 is swept or scanned at the amplitude of 17 cm by the beam. The magnetic field is constant in the electro-magnet 6. Therefore, there is no eddy current and so there is no time lag due to the change of the magnetic field. The on beam is scanned at the frequency of about 100 Hz along the plane of FIG. 5. The substrate 10 is driven vertically and mechanically at the frequency of 1 Hz at the same time. The ion beam of large current such as a few mA can be uniformly injected into the substrate 10.

Then the electro-static potential is modulated for scanning or sweeping the ion beam, there is considered the problem that the space charge neutralization is lost by the electro-static field applied to the beam. Accordingly, the electrode assemblies 5 and 8 are arranged at the front and back of the deflection chamber 7. As shown in FIG. 6, large negative potential $V_2$ which is lower than potential $V_3$, is applied to the deflection chamber 7. Thus, electrons can be prevented from discharging from the deflection chamber 7. And the ion beam can be prevented from diverging due to the space charge effect.

Figure 8:
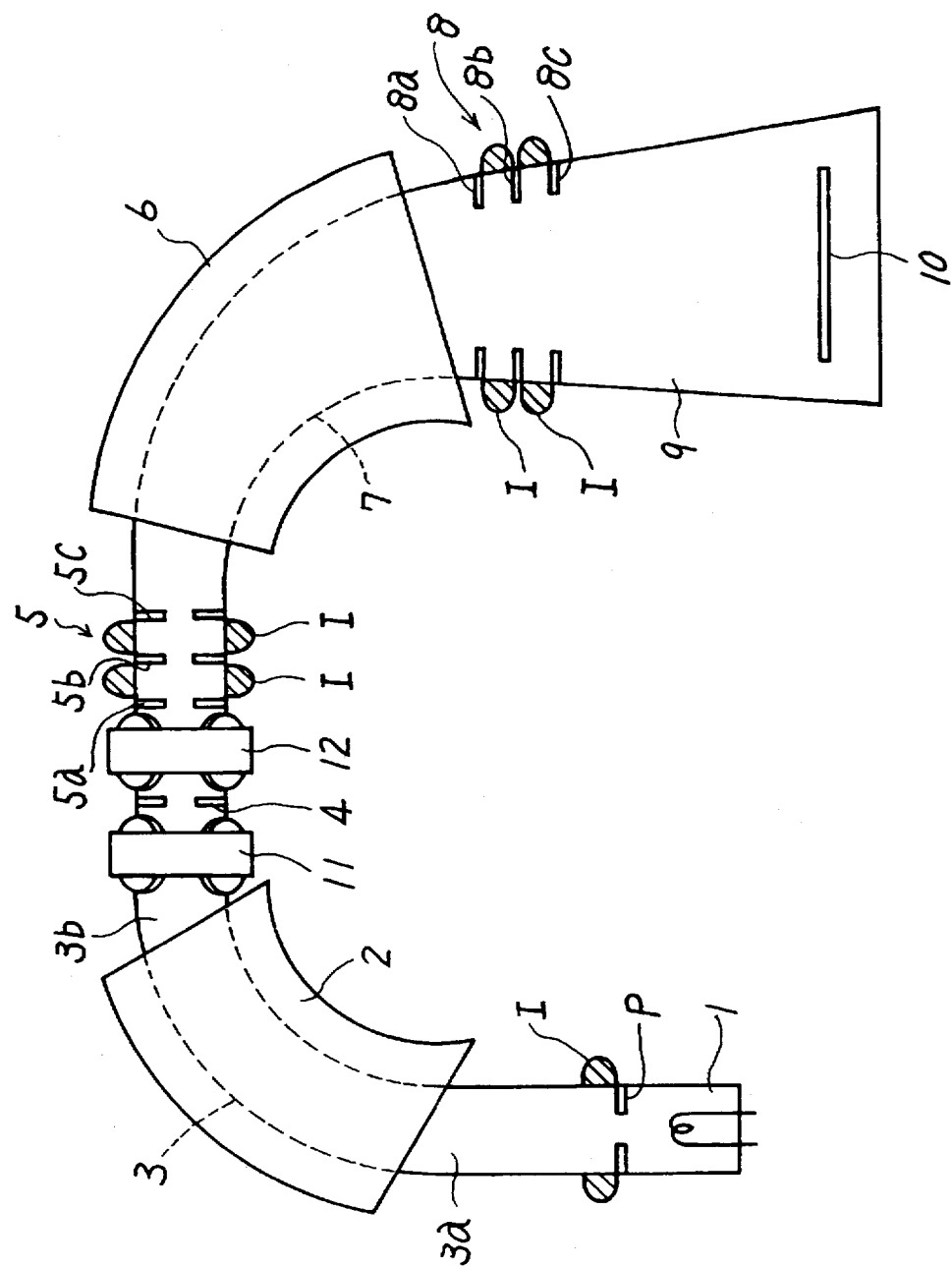
FIG. 8 is a plan view of an ion implantation apparatus according to a second embodiment of this invention.

FIG. 8 shows the second embodiment of this invention. A first quadru-pole electro-magnet 11 is arranged between the mass separation electro-magnet 2 and the mass separation slit 4, and a second quadru-pole electro-magnet 12 is arranged between the mass separation slit 4 and the deflection electro-magnet 6. And the quadru-pole electro-magnets 11 and 12 are independently controlled of each other.

Figure 9:
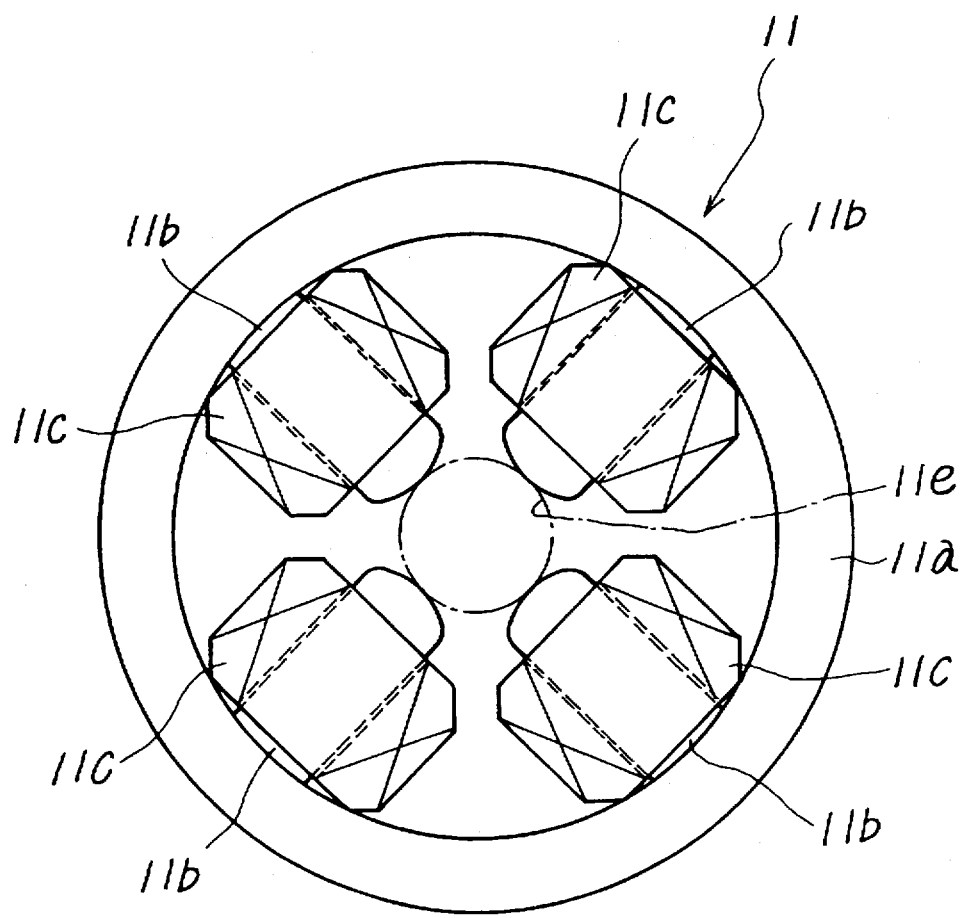
FIG. 9 is a front view of an important part of the apparatus of FIG. 8.

The first and second quadru-pole magnets 11 and 12 are called magnetic quadru-pole lenses, also. The construction is shown in FIG. 9. It consists of an annular yoke portion 11*a* made of magnetic material and four magnetic poles 11*b*, 11*b*, 11*b* and 11*b* formed integrally with the inner circumferencial wall of the annular yoke portion 11*a*. Electromagnetic coils 11*c*, 11*c*, 11*c* and 11*c* are wound on the magnetic poles 11*b*, 11*b*, 11*b* and 11*b*. When electric current are flowed through the coils 11*c*, the ion beam passing through an ion path 11*e* defined by the magnetic poles 11*b* is converged by the lens operations of the quadru-pole lenses 11 and 12.

Figure 10:
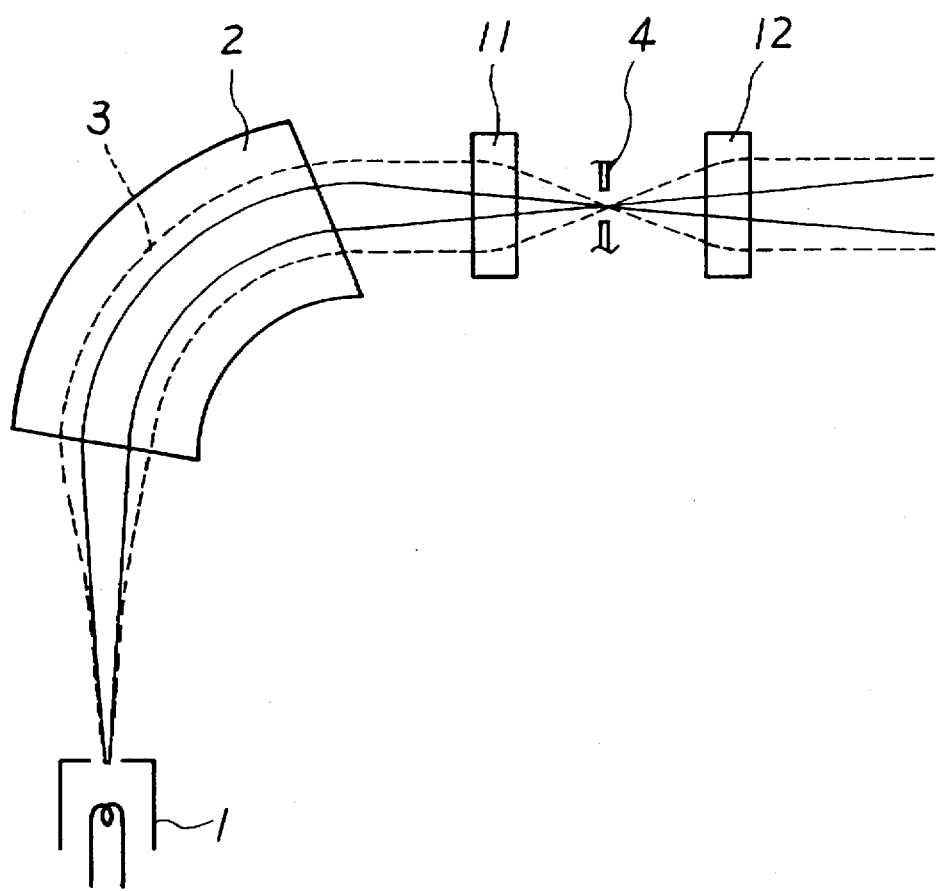
FIG. 10 is a schematic plan view for explaining the operations of the apparatus of FIG. 8.

In this embodiment, a spreaded or diverged ion beam is schematically shown by the dash-line in FIG. 10. The solid line shows the case that the beam current is small and so the influence of the space charge effect is small. The dash line shows the case wherein the beam current is large and so the spread due to the space charge effect is remarkable. The first quadru-pole electro-magnet 11 is arranged between the mass separator 2, and the mass separation slit 4. The coil current flowing in the first quadru-pole electro-magnet 11 is adjusted to change the lens operation, and the resolving power can be prevented from lowering, without depending on the beam current. In this case, the angle distribution of the ion beam passing through the mass separation slit 4 changes with the lens operation of the quadru-pole electro-magnet 11. In order to rectify the beam spread, the first and second quadru-pole lenses 11 and 12 are independently controlled of each other. Thus, the angle distribution of the ion beam after passing through the mass separation slit 4 can be maintained at constant despite the beam current. Accordingly, the dose uniformity of the ion implantation into the substrate 10 can be maintained at a constant.

Figure 11:
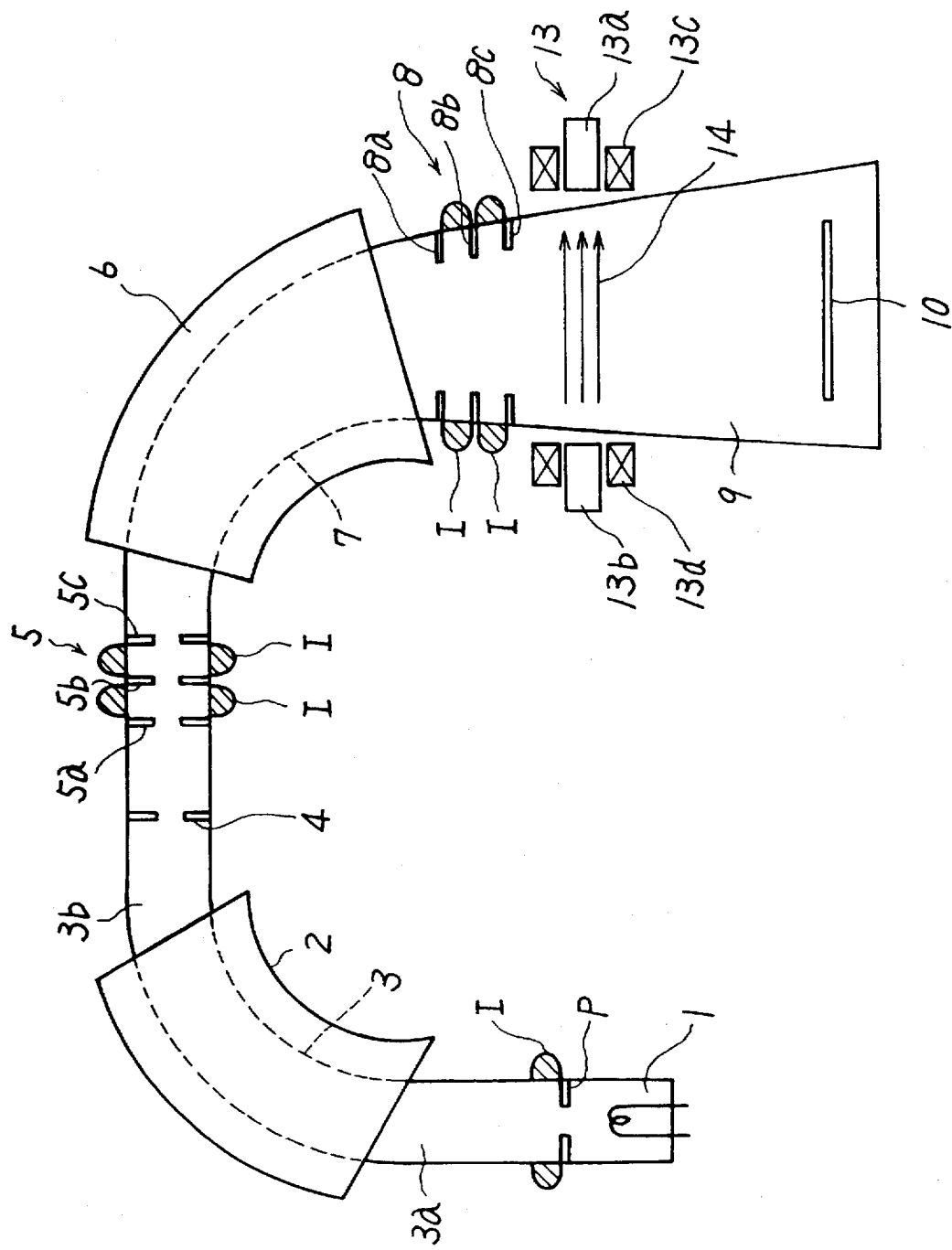
FIG. 11 is a plan view of an ion implantation apparatus according to a third embodiment of this invention.

FIG. 11 shows a third embodiment of this invention. In FIG. 11, a second deflection electro-magnet 13 is arranged at the front of the electrode assembly 8. The direction of the magnetic field from the second deflection electro-magnet 13 is perpendicular to the flow direction of the ion beam and to the direction of the magnetic field from the first deflection electro-magnet 6. In this embodiment, the substrate 10 is mechanically fixed.

The second deflection electro-magnet 13 consists of two C-shaped electro-magnetic cores 13*a* and 13*b* arranged outside of the scanning tube 9 and the electro-magnetic coils 13*c* and 13*d* wound on the electro-magnetic cores 13*a* and 13*b*. When the current flows through the electro-magnetic coils 13*c* and 13*d*, the magnetic field is generated in the direction as shown by the arrows 14. The electro-magnetic cores 13*a* and 13*b* may be united with each other in the C-shape and one electro-magnetic coil may be wound on the center of the arm portion of the united electro-magnetic cores 13*a* and 13*b*. Of course, when the current flows through the united electro-magnetic coil, a magnetic field is generated similarly in the direction by the arrows 14. In any regard, the ion beam intersects with the magnetic fields from the first and second deflection electro-magnets 6 and 13.

In this embodiment, the potential of the deflection chamber 7 is modulated at a high rate such as about 100 Hz and the ion beam is swept or scanned along the plane of FIG. 7. Further, the magnetic field of the second deflection electromagnet 13 is alternately changed at the frequency of a few Hz, and so the ion beam is scanned in the direction perpendicular to the plane of FIG. 11. The ion beam is injected onto the fixed substrate 10. The fixed substrate 10 is scanned by the ion beam at the frequency of 100 Hz along the plane of FIG. 11 and at the frequency of a few Hz in the direction perpendicular to the plane of FIG. 11. Thus, the substrate 10 is two-dimensionally uniformly scanned. Accordingly, a large current of ion beam of about ten mA can be uniformly implantated into the substrate 10.

Figure 12:
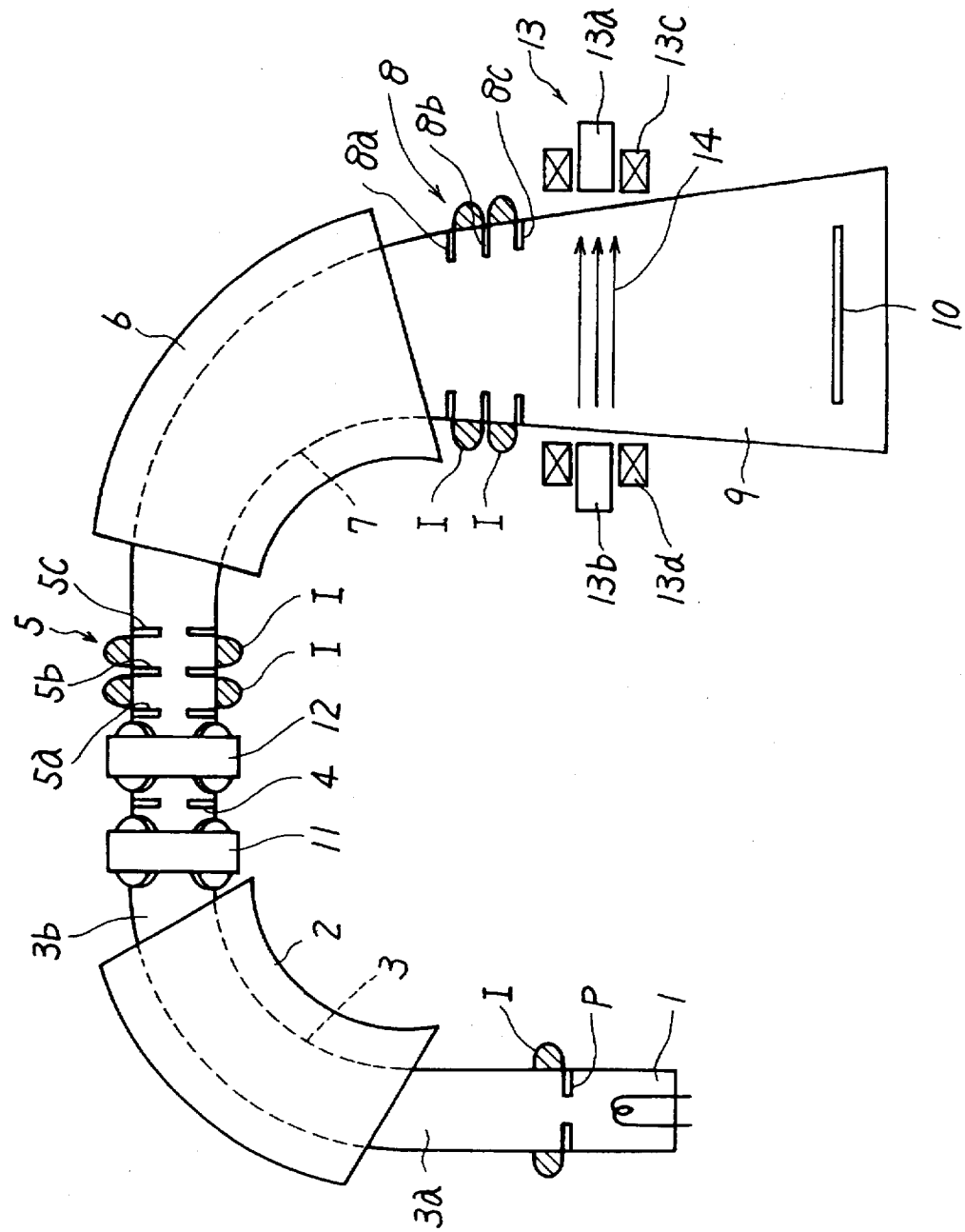
FIG. 12 is a plan view of an ion implantation apparatus according to a fourth embodiment of this invention.

FIG. 12 shows the fourth embodiment of this invention.

In this embodiment, the first and second quadru-pole lenses 11 and 12 are additionally arranged at both sides of the mass separation slit 4 with respect to FIG. 11. The effects of the second and third embodiments can be obtained by this embodiment.

Figure 13:
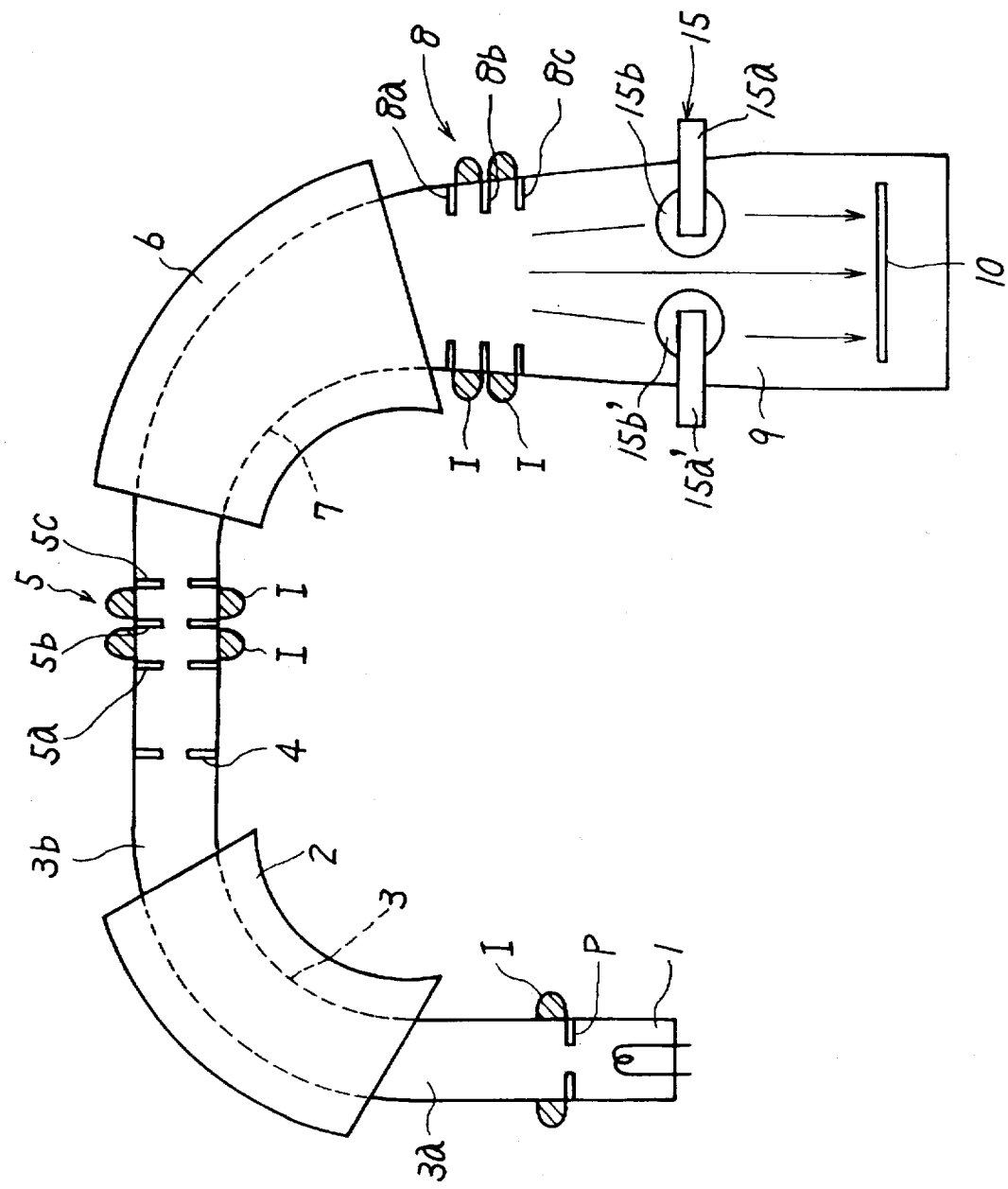
FIG. 13 is a plan view of an ion implantation apparatus according to a fifth embodiment of this invention.
Figure 15:
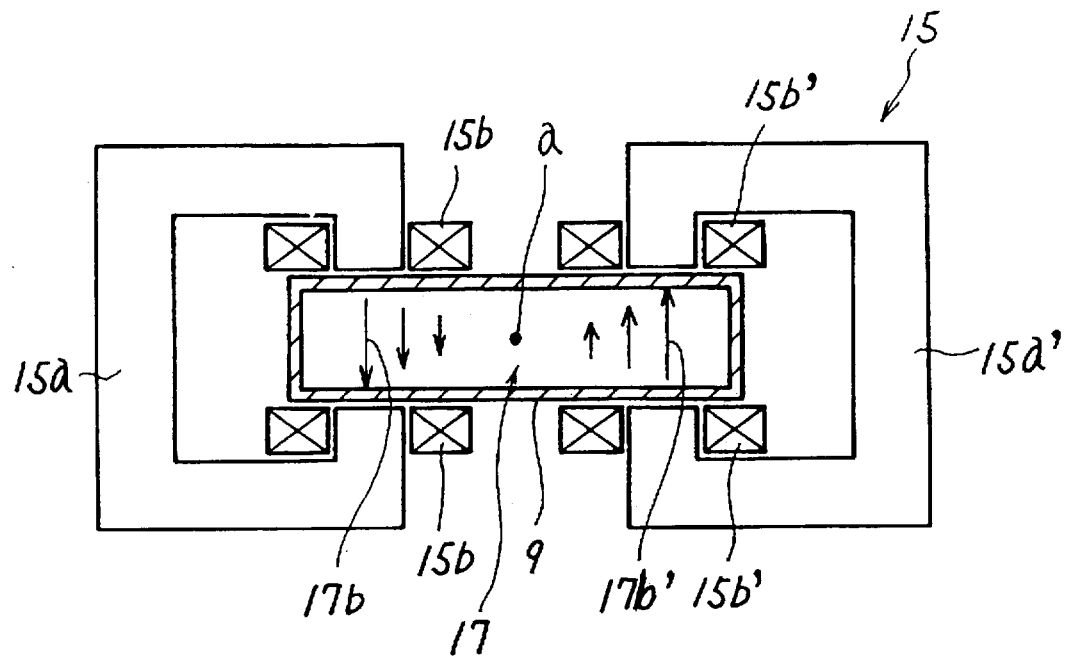
FIG. 15 is a cross-sectional view of an important part of the apparatus of FIG. 13.

FIG. 13 shows a fifth embodiment of this invention. In FIG. 13, an angle compensation electro-magnet 15 is arranged between the electrode assembly 8 and the substrate 10. FIG. 15 shows the detail of the angle compensation electro-magnet 15. As shown in FIG. 15, there are provided a pair of C-shaped electro-magnetic cores 15*a* and 15*a*' so that magnetic fields 17*b* and 17*b*' are generated in unsymmetrically in the air gap with respect to the reference axis a.

In FIG. 15, the pair of C-shaped electro-magnetic cores 15*a* and 15*a*' are arranged outside of the scanning tube 9 which constitutes a part of the vacuum chamber. The electromagnetic coils 15*b* and 15*b*' are wound on the arm portions of the electro-magnetic cores 15*a* and 15*a*'. Currents opposite to each other are flowed through the electro-magnetic coils 15*b* and 15*b*' and so unsymmetrical magnetic fields 17*b* and 17*b*' are generated in the air gaps with respect to the reference axis a. The magnetic field intensity is zero on the reference axis a and the longer the distance from the reference axis a, the more intense the magnetic fluxes 17*a* and 17*b*'.

Figure 14:
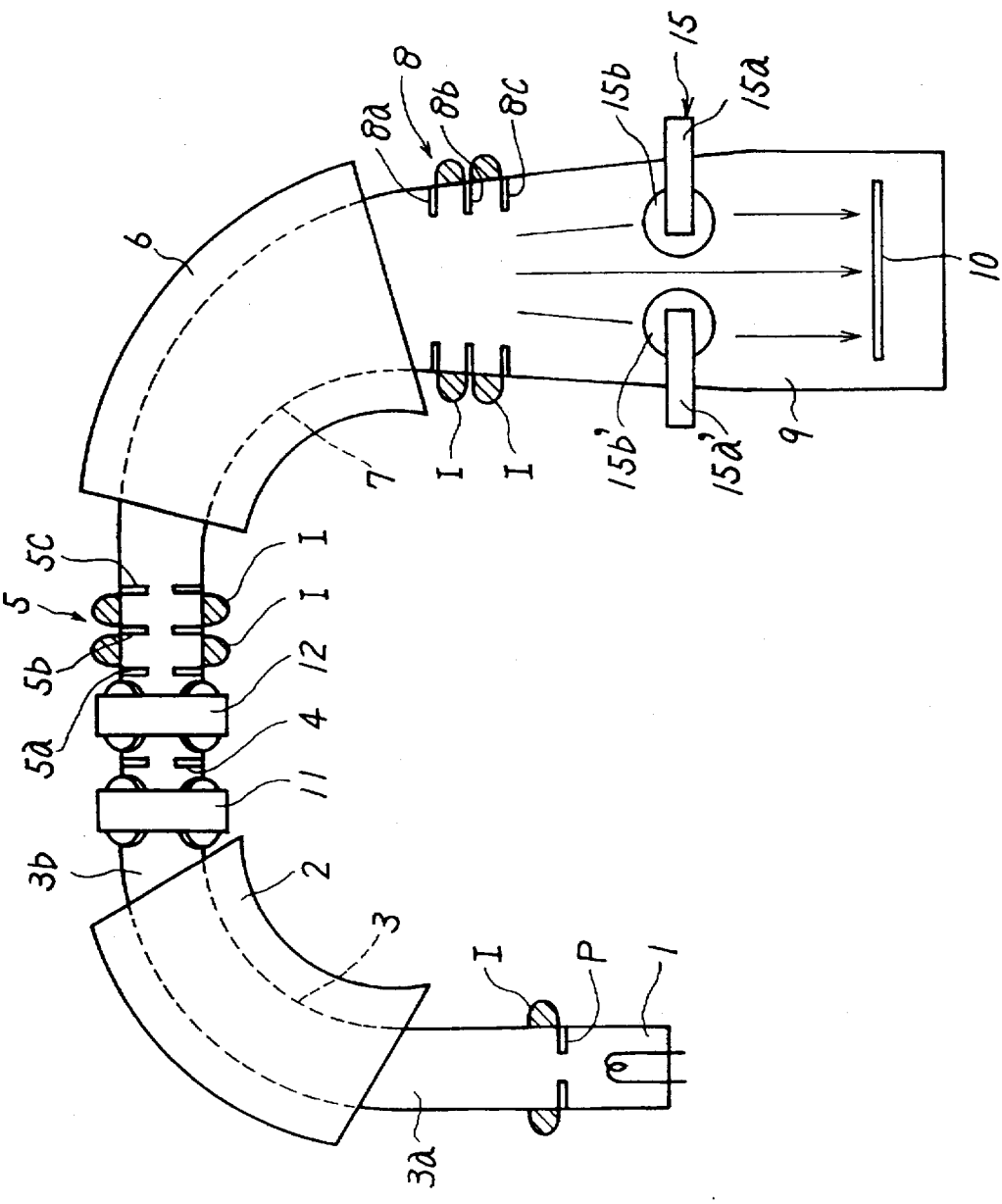
FIG. 14 is a plan view of an ion implantation apparatus according to a sixth embodiment of this invention.

The ion beam is scanned along the plane of the FIG. 14 in the deflection chamber 7, and in the pair of angle compensation electro-magnetic cores 15*a* and 15*a*', the ion beam is entirely made parallel with respect to the reference axis a by the unsymmetrical magnetic fields 17*b* and 17*b*' and so the entire ion beam is irradiated perpendicularly to the substrate 10. Thus, the ion beam can be more uniformly scanned onto the substrate 10, maintaining the constant incident angle between the ion beam and the substrate 10.

Figure 16:
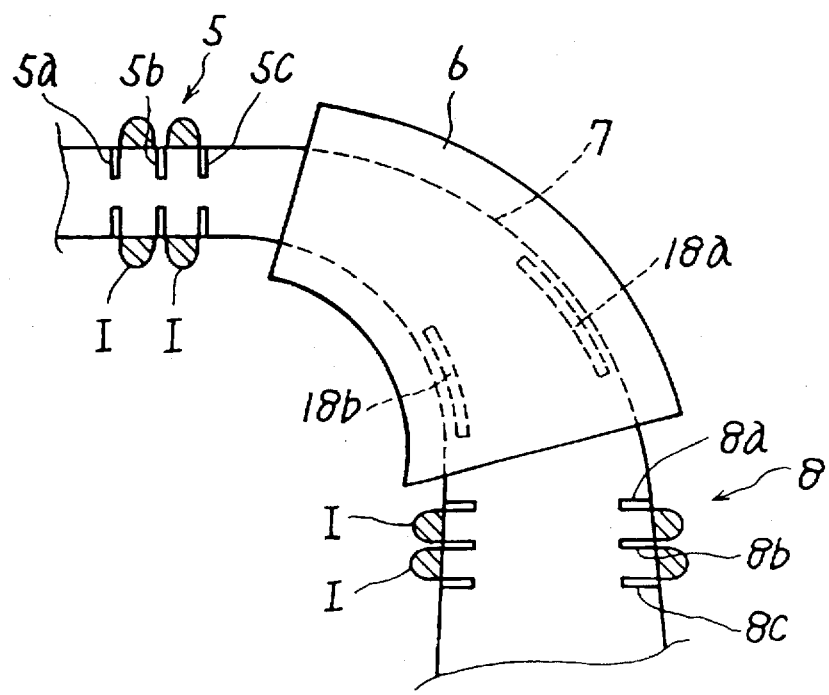
FIG. 16 is a partial plan view of an ion implantation apparatus according to a seventh embodiment of this invention.

FIG. 16 shows a sixth embodiment of this invention. In FIG. 16, a pair of deflection electrodes 18*a* and 18*b* are arranged in the deflection chamber 7. The electro-static field from the pair of deflection electrodes 18*a* and 18*b* is perpendicular to the magnetic field from the deflection electro-magnet 6. When the current amount of the ion beam is over a few mA, it is not preferable that an electro-static field is applied to the ion beam, because of facilitation of the space charge neutralization. On the other hand, when the beam current is under a few mA, it is easy to scan the ion beam at the frequency of 1000 Hz by the electro-static field deflector.

Accordingly, when the beam current is under a few mA, the potential applied to the deflection chamber 7 is fixed at the ground level $V_0$, the magnetic field of the deflection electro-magnet 6 is made constant and the potential applied to the deflection electrodes 18*a* and 18*b* is modulated alternatively at the frequency of 1000 Hz. Thus, the ion beam is swept or scanned along the plane of FIG. 16 at the high frequency and the ion beam can be uniformly injected to the substrate 10. On the other hand, when the beam current is over a few mA, the potential applied to the deflection electrode 18*a* and 18*b* is made equal to that of the deflection chamber 7. Thus, the beam can be scanned in the same manner as the first embodiment. Thus, when the beam current is over a few mA, the ion beam is scanned at the frequency of about 100 Hz and when the beam current is under a few mA, the ion beam can be scanned at the frequency of 1000 Hz. Thus, the ion beam can be scanned always uniformly onto the substrate in the same apparatus.

While the preferred embodiments have been described, variations there-to will occur to those skilled in the art within the scope of the present inventive concepts which are delineated by the following claims.

For example, in the third embodiment of this invention, the pair of angle compensation deflection magnetic cores 13a and 13b are provided and the substrate 10 is fixed at the downstream of the deflection magnetic cores 13a, 13b. Also, the currents flowing through the deflection magnetic coils 13c and 13d are controlled so that the ion beam current is scanned perpendicular to plane of the FIG. 11. However, also in this case, the angle compensation electro-magnet 15 as shown in FIG. 13 may be arranged so as to irradiate the substrate 10 at the constant incident angle, as shown in the fifth embodiment.

Further, in the third embodiment, the pair of quadru-pole lenses 11 and 12 may be arranged as in the second embodiment so that the mass-resolving power is rised in the case of large current of ion beam.

Further, in the fourth embodiment, the first and second quadru-pole electro-magnets 11 and 12 may be arranged as shown in the second embodiment at both sides of the mass separation slit 4. Thus, the same effect can be obtained.

Further, in the fifth embodiment, the electrostatic deflectors 18a and 18b are arranged in the deflection chamber 7. Instead, the electrostatic deflectors 18a and 18b may be arranged outside of the deflection chamber 7 at the downward stream side.

What is claimed is:

1. An ion implantation apparatus including: an ion source and a mass analyzer having an analyzer magnet for extracting ions having a predetermined kinetic energy and mass from the ion source, and a scanner for scanning an ion beam of the extracted ions and irradiating the ion beam onto a substrate, the improvements comprising; said scanner including a deflection electro-magnet disposed downstream of said mass analyzer for deflecting said ion beam in a predetermined plane with respect to a reference axis, a second vacuum chamber portion containing said deflecting electro-magnet through which said ion beam passes, a first vacuum chamber portion electrically independent of said second vacuum chamber portion and containing said mass analyzer through which said ion beam pass, and a third vacuum chamber portion through which said ion beam passes and in which said substrate is arranged, said second vacuum chamber portion is applied by a potential for modulating potential of said ion beam, and said deflection electro-magnet deflects said modulated ion beam so that the deflection angle of said modulated ion beam is modulated and said modulated ion beam is scanned and irradiated onto said substrate.

2. An ion implantation apparatus according to claim 1, said second vacuum chamber portion having an upstream entrance and a downstream exit and including electrodes arranged at the entrance and exit of said second vacuum chamber portion, and a negative potential is applied to said electrodes, said negative potential being sufficiently lower than the modulated potential applied to said second vacuum chamber portion.

3. An ion implantation apparatus according to claim 2, in which a mass separation slit is disposed downstream of said mass analyzer, a first magnetic quadru-pole lens disposed between said mass analyzer and said mass separation slit and a second magnetic quadru-pole lens disposed between said mass separation slit and said electrodes at the entrance of said deflection electro-magnet, and said first and second magnetic quadra-pole lenses independently controlled of each other.

4. An ion implantation apparatus according to, claim 2 in which a second deflection electro-magnet is disposed downstream of said first mentioned deflection electro-magnet and the deflecting plane of said first deflection electro-magnet is perpendicular to that said second deflection electro-magnet.

5. An ion implantation apparatus according to claim 2 in which a pair of ion beam angle compensation electro-magnets are disposed downstream of said deflection electro-magnet for generating magnetic fields unsymmetrical with respect to said reference axis in a surface perpendicular to the deflection plane of said first deflection electro-magnet whereby the deflected ion beam is rectified with respect to said reference axis, and irradiated onto said substrate.

6. An ion implantation apparatus accordingly to, claim 2 in which an electro-static deflector is disposed in said second vacuum chamber portion.

7. An ion implantation apparatus according to claim 1, in which a mass separation slit is disposed downstream of said mass analyzer, a first magnetic quadru-pole lens disposed between said mass analyzer and said mass separation slit and a second magnetic quadru-pole lens disposed between said mass separation slit and said deflection electro-magnet, and said first and second magnetic quadru-pole lenses independently controlled of each other.

8. An ion implantation apparatus according to, claim 7 in which a second deflection electro-magnet is disposed downstream of said first mentioned deflection electro-magnet and the deflecting plane of said first deflection electro-magnet is perpendicular to that said second deflection electro-magnet.

9. An ion implantation apparatus according to claim 7 in which a pair of ion beam angle compensation electro-magnets are disposed downstream of said deflection electro-magnet for generating magnetic fields unsymmetrical with respect to said reference axis in a surface perpendicular to the deflection plane of said deflection electro-magnet whereby the deflected ion beam is rectified with respect to said reference axis, and irradiated onto said substrate.

10. An ion implantation apparatus accordingly to, claim 7 in which an electro-static deflector is disposed in said second vacuum chamber portion.

11. An ion implantation apparatus according to, claim 1 in which a second deflection electro-magnet is disposed downstream of said first mentioned deflection electro-magnet and the deflecting plane of said first deflection electro-magnet is perpendicular to that of said second deflection electro-magnet.

12. An ion implantation apparatus accordingly to, claim 11 in which an electro-static deflector is disposed in said second vacuum chamber portion.

13. An ion implantation apparatus according to claim 1 in which a pair of ion beam angle compensation electro-magnets are disposed downstream of said deflection electro-magnet for generating magnetic fields unsymmetrical with respect to said reference axis in a surface perpendicular to the deflection plane of said first deflection electro-magnet whereby the deflected ion beam is rectified with respect to said reference axis, and irradiated onto said substrate.

14. An ion implantation apparatus accordingly to, claim 13 in which an electro-static deflector is disposed in said second vacuum chamber portion.

15. An ion implantation apparatus accordingly to, claim 1 in which an electro-static deflector is disposed in said second vacuum chamber portion.

* * * * *

UNITED STATES PATENT AND TRADEMARK OFFICE
CERTIFICATE OF CORRECTION

PATENT NO. : 5,751,002
DATED : May 12, 1998
INVENTOR(S) : Seji Ogata, et. al.

It is certified that error appears in the above-identified patent and that said Letters Patent is hereby corrected as shown below:

Title page, item [57], Abstract, line 20, change "be" to --beam--.

Col. 1, line 20, change "cons" to -- ions --.

Col. 1, line 22, change "separated" to -- mass-separated --.

Col. 1, line 49, change "into" to -- onto --.

Col. 1, line 60, change "(mass of ion)$^{1/2+1"}$" to -- (mass of ion)$^{1/2"}$ --.

Col. 2, line 16, change "HZ" to -- Hz --.

Col. 2, line 17, change "The" to -- the --.

Col. 2, line 45, change "10 mmA" to -- 10 mA --.

Col. 2, line 48, change "middle" to -- medium --.

Col. 3, line 7, insert -- remarkable -- after "more".

UNITED STATES PATENT AND TRADEMARK OFFICE
CERTIFICATE OF CORRECTION

PATENT NO. : 5,751,002
DATED : May 12, 1998
INVENTOR(S) : Seko Pgata. et. al.

It is certified that error appears in the above-identified patent and that said Letters Patent is hereby corrected as shown below:

Col. 3, line 17, delete "and" after "magnet".

Col. 4, line 26, change "3a" to -- 3b --.

Col. 4, line 37, change "at at" to -- at --.

Col. 4, line 46, insert -- is -- after "$V_1$".

Col. 5, line 54, insert -- as -- before "$\phi = \phi_o + \delta\phi$".

Col. 5, line 63, change "he" to -- the --.

Col. 6, line 2, change "anoint" to -- point --.

Col. 6, line 32, delete "voltage".

Col. 6, line 38, delete "voltage".

Col. 6, line 42, change "on" to -- ion --.

Col. 6, line 48, change "Then" to -- When --.

Col. 7, line 13, change "that" to -- wherein --.

Col. 7, line 18, change "separater" to -- separation electro-magnet --.

Col. 8, line 13, delete "in".

UNITED STATES PATENT AND TRADEMARK OFFICE
CERTIFICATE OF CORRECTION

PATENT NO. : 5,751,002  
DATED : May 12, 1998  
INVENTOR(S) : Seji Ogata, et. al.

Page 3 of 4

It is certified that error appears in the above-identified patent and that said Letters Patent is hereby corrected as shown below:

Col. 8, line 13 - 14, change "unsymmetrically" to -- antisymmetrically --.

Col. 8, line 21, change "unsymmetrical" to -- antisymmetrical --.

Col. 8, line 25, change "17a" to -- 17b --.

Col. 8, line 31, change "unsymmetrical" to -- antisymmetrical --.

Col. 10, line 9, change "unsymmetrical" to -- antisymmetrical --.

Col. 10, line 10, change "surface" to -- plane --.

Col. 10, line 33, change "unsymmetrical" to -- antisymmetrical --.

Col. 10, line 34, change "surface" to -- plane --.

Col. 10, line 53, change "unsymmetrical" to -- antisymmetrical --.

UNITED STATES PATENT AND TRADEMARK OFFICE
CERTIFICATE OF CORRECTION

PATENT NO. : 5,751,002
DATED : May 12, 1998
INVENTOR(S) : Seji Ogata, et. al.

It is certified that error appears in the above-identified patent and that said Letters Patent is hereby corrected as shown below:

Col. 10, line 54, change "surface" to -- plane --.

Signed and Sealed this

Seventeenth Day of November, 1998

Attest:

BRUCE LEHMAN

*Attesting Officer*   Commissioner of Patents and Trademarks